United States Patent [19]

Takekawa et al.

[11] Patent Number: 5,350,947
[45] Date of Patent: Sep. 27, 1994

[54] FILM CARRIER SEMICONDUCTOR DEVICE

[75] Inventors: Kouichi Takekawa; Michitaka Urushima, both of Tokyo, Japan

[73] Assignee: NEC Corporation, Tokyo, Japan

[21] Appl. No.: 967,790

[22] Filed: Oct. 28, 1992

[30] Foreign Application Priority Data

Nov. 12, 1991 [JP] Japan .................................. 3-295326
Mar. 11, 1992 [JP] Japan .................................. 4-052100

[51] Int. Cl.$^5$ ............................................ H01L 23/48
[52] U.S. Cl. .................................... 257/702; 257/737; 257/778
[58] Field of Search ......................... 257/737, 778, 702

[56] References Cited

U.S. PATENT DOCUMENTS 5,029,325 7/1991 Higgins, III et al. ............... 257/737
5,083,191 1/1992 Ueda ................................. 257/737

FOREIGN PATENT DOCUMENTS 49-52973 5/1974 Japan .
8134449 10/1983 Japan .

Primary Examiner—Rolf Hille
Assistant Examiner—Roy Potter

[57] ABSTRACT

A film carrier semiconductor device includes a film carrier tape, an outer lead bonding bump mounting portion, a semiconductor chip, inner lead bonding leads, and outer lead bonding bumps. The film carrier tape consists of a tape-like insulating material and has carrying and positioning sprocket holes in its both edge portions. The outer lead bonding bump mounting portion is formed in a central portion of the film carrier tape. The semiconductor chip is mounted on the outer lead bonding bump mounting portion and has electrode bumps formed on electrode pads. The inner lead bonding leads are formed into a predetermined pattern on the film carrier tape and connected to the electrode bumps. The outer lead bonding bumps are formed on the outer lead bonding bump mounting portion, to each of which one end of a corresponding one of the inner lead bonding leads is connected.

11 Claims, 5 Drawing Sheets

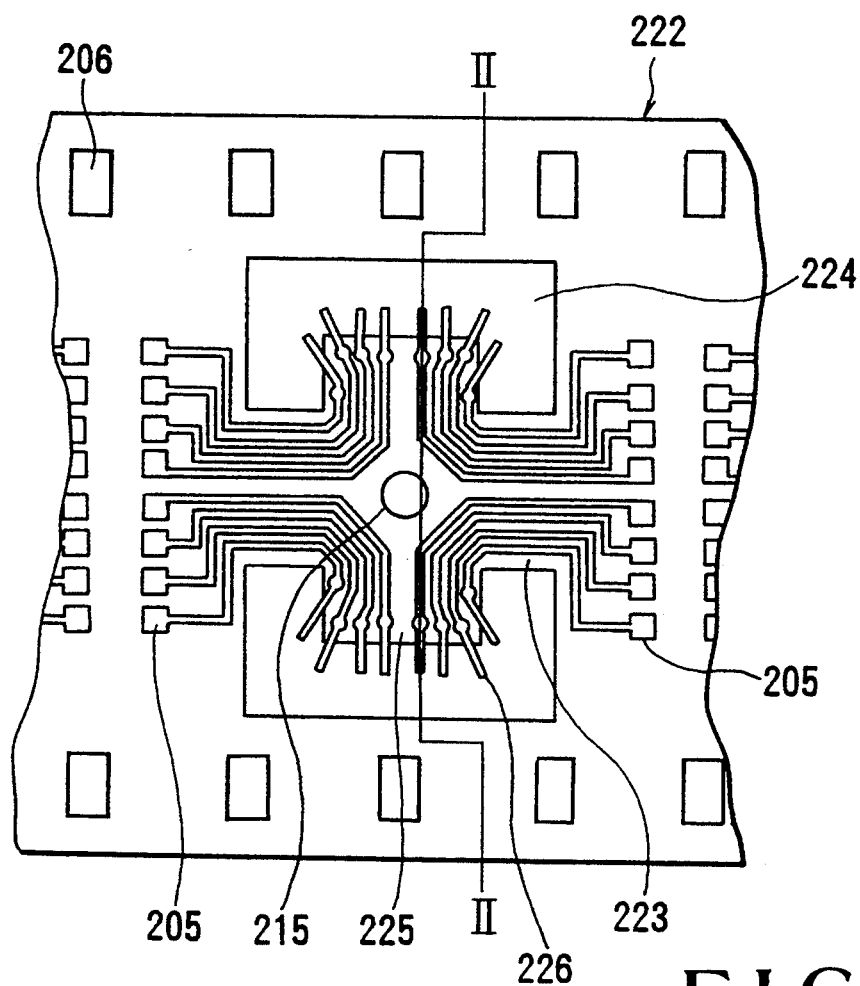
F I G. 4
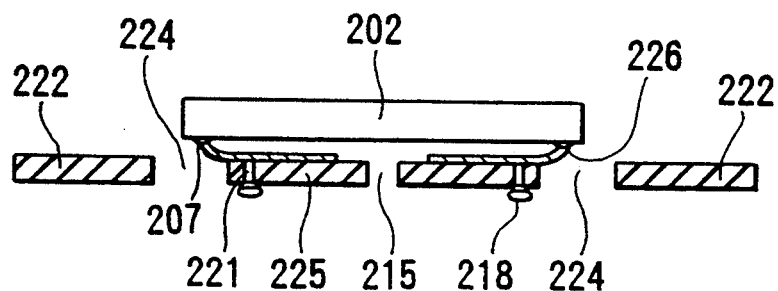
F I G. 5A
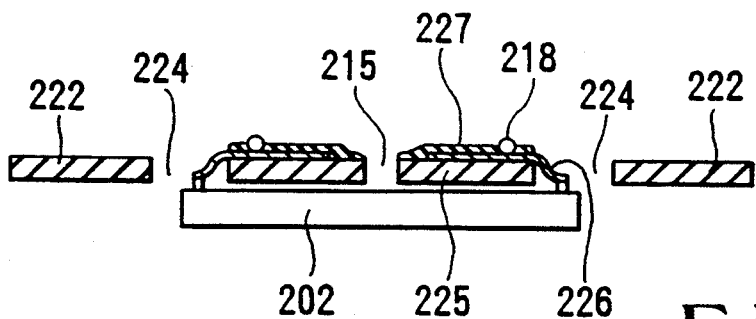
F I G. 5B

FILM CARRIER SEMICONDUCTOR DEVICE

BACKGROUND OF THE INVENTION

The present invention relates to a film carrier semiconductor device and, more particularly, to a film carrier semiconductor device suitable for high-density packaging.

A film carrier semiconductor device has a package of a type called a tape automated bonding type and can be made thinner and smaller than packages of the other types. Therefore, film carrier semiconductor devices are widely used in, e.g., general consumer watches and calculators.

FIGS. 8A and 8B are plan and sectional views, respectively, showing the main part of a conventional film carrier semiconductor device of this type. This film carrier semiconductor device comprises an elongated film carrier tape 1 consisting of a polyimide film or the like, a semiconductor chip 2 with bumps 7 as metal projecting portions formed on electrode pads, leads 4 for external connections, which are formed into a desired pattern by etching a metal foil, such as a copper foil, adhered to the surface of the carrier tape 1, and pads 5 for electrical selection, i.e., for performing electrical selection or a bias test by selectively bringing a probe of a meter into contact with the pads 5 in the form of the film carrier tape. The film carrier tape 1 has carrying and positioning sprocket holes 6 and a device hole 3 for mounting the semiconductor chip 2. Note that reference numeral 8 denotes a suspender for supporting the leads 4.

To fabricate the film carrier semiconductor device having the above arrangement, the film carrier tape 1, the leads 4, and the bumps 7 formed on the semiconductor chip 2 are bonded together by thermocompression bonding or eutectic bonding, i.e., by inner lead bonding (ILB). Subsequently, with the semiconductor chip 2 mounted on the film carrier tape 1, a probe is brought into contact with each pad 5 for electrical selection to perform electrical selection, a bias test, or the like, thereby completing the film carrier semiconductor device. In general, the suspender 8 as an insulating film frame is formed on the film carrier tape 1 to prevent deformation of the leads 4, or resin encapsulation is performed by potting a resin 9 in order to improve the reliability and obtain mechanical protection.

To mount the film carrier semiconductor device as described above on a printed circuit board, as shown in FIG. 8C, the leads 4 are cut into a desired length to separate the semiconductor chip 2 from the film carrier tape. Subsequently, the semiconductor chip 2 is fixed on a printed circuit board 11 by an adhesive 10. Thereafter, the leads 4 are bonded to bonding pads 12 on the printed circuit board 11 by outer lead bonding (OLB), thereby completing packaging of the semiconductor chip 2.

In this film carrier semiconductor device, since bonding between the semiconductor chip 2 and the leads 4 for external connections can be performed at once regardless of the number of leads, the speed of the bonding process is high. In addition, the use of the film carrier tape 1 facilitates automatization of assembly, such as bonding, and tests, such as electrical selection. Therefore, the film carrier semiconductor device has advantages such as good mass production properties.

Furthermore, packaging can be performed at higher densities than in ceramic packages or plastic packages, and it is also possible to realize a small size, a light weight, and a low profile.

One currently available semiconductor chip which is lightest and thinnest, and can be packaged at a highest density is a flip chip. As is well known, the flip chip is fabricated by forming lattice-like electrodes on the surface of a semiconductor chip, forming bumps consisting of solder or the like on these electrodes, and connecting these bumps directly to bonding pads on a printed circuit board. This flip chip is the most advanced form in terms of a light weight, a low profile, and a small size. The flip chip is also effective and appropriate in increasing the number of terminals because electrodes can be arranged on the entire surface of a semiconductor chip.

Although, however, the flip chip has a number of advantages as described above, a large difference is present between the thermal expansion coefficient of silicon as the main material of a semiconductor chip and that of a printed circuit board, and this produces a stress against connecting portions. Since the connection strength is degraded by this stress and it is very difficult to perform electrical screening at a high temperature, i.e., a burn-in test before packaging, the range of applications of the flip chip is greatly limited.

The film carrier semiconductor device, on the other hand, can keep its high connection reliability by the buffering effect of the leads 4 even after mounted on a printed circuit board and also has an advantage that the burn-in test can be easily performed using the pads 5 for electrical selection. However, the film carrier semiconductor is inferior to the flip chip in packaging density by the amount of an area where the leads 4 are present.

Also, the conventional film carrier semiconductor device described above comprises a film carrier tape consisting of a polyimide resin and leads consisting of a copper foil, and the thermal expansion coefficient of the polyimide resin is about $2.0 \times 10^{-5}$ $C.^{-1}$ and that of Cu is about $1.7 \times 10^{-5}$ $C.^{-1}$, whereas the thermal expansion coefficient of the semiconductor chip consisting of Si is about $2.5 \times 10^{-6}$ $C.^{-1}$; that is, a large difference is present between their thermal expansion coefficients. Because of this large difference, when the film carrier semiconductor device is subjected to a thermal shock test, such as a temperature cycle test, a repetitive stress is applied to the leads to finally disconnect them since the expansion and contraction of the film carrier tape are larger than those of the semiconductor chip.

To prevent this, the thermal expansion coefficient of the polyimide resin may be decreased. For example, when film carrier semiconductor devices using, as film carrier tapes, Kapton having a thermal expansion coefficient of $2.0 \times 10^{-5}$ $C.^{-1}$, available from DU PONT-TORAY CO., LTD. and Upilex S having that of $1.5 \times 10^{-5}$ $C.^{-1}$, available from Ube Industries Ltd., were subjected to a temperature cycle test at a temperature of $-65°$ C. to $150°$ C., leads of the device using Kapton were disconnected after about 100 cycles, while those of the device using Upilex S were not disconnected even after about 300 cycles. Therefore, if the thermal expansion coefficient of the film carrier tape is further decreased to be equivalent to that of the semiconductor chip, the service life of the device may be prolonged. In this case, however, the thermal expansion difference from Cu constituting the leads is increased. Therefore, when, for example, a Cu foil to be used as leads is laminated during the fabrication process of the film carrier tape, the film carrier tape is largely curled due to the thermal expansion difference to make it difficult to maintain the flatness of the film carrier tape.

In general, the Cu foil is laminated on the film carrier tape via an adhesive. In this case, since lamination is performed by heating the adhesive, the temperature is high during lamination and then decreased to room temperature after that. Therefore, a curl is produced in the laminated film carrier tape due to the difference between thermal expansion coefficients. In general, therefore, a film carrier tape and a Cu foil having substantially equal thermal expansion coefficients are often used, and to meet the temperature cycle, a lead length in a device hole is increased to absorb the stress by a lead portion. In this case, however, the degree of lead deformation is increased.

SUMMARY OF THE INVENTION

It is a principal object of the present invention to provide a film carrier semiconductor device capable of obtaining a packaging density equivalent to that of a flip chip.

It is another object of the present invention to provide a film carrier semiconductor device having a high connection reliability and capable of facilitating a burn-in test.

It is still another object of the present invention to provide a film carrier semiconductor device capable of preventing lead disconnections caused by thermal expansion.

In order to achieve the above objects of the present invention, there is provided a film carrier semiconductor device comprising a film carrier tape consisting of a tape-like insulating material and having carrying and positioning sprocket holes in its both edge portions, an outer lead bonding bump mounting portion formed in a central portion of the film carrier tape, a semiconductor chip mounted on the outer lead bonding bump mounting portion and having electrode bumps formed on electrode pads, inner lead bonding leads formed into a predetermined pattern on the film carrier tape and connected to the electrode bumps, and outer lead bonding bumps formed on the outer lead bonding bump mounting portion, to each of which one end of a corresponding one of the inner lead bonding leads is connected.

BRIEF DESCRIPTION OF THE DRAWINGS

FIGS. 1A to 1C show the first embodiment of a film carrier semiconductor device according to the present invention, in which FIG. 1A is a bottom view showing the main part of the embodiment, FIG. 1B is a plan view showing the same, and FIG. 1C is a sectional view taken along a line I—I of FIG. 1A;

FIG. 4 is a plan view of a film tape showing the second embodiment of a film carrier semiconductor device according to the present invention;

FIGS. 5A and 5B are sectional views showing assembled states of the film carrier semiconductor device shown in FIG. 4;

DESCRIPTION OF THE PREFERRED EMBODIMENTS

Figure 1A:
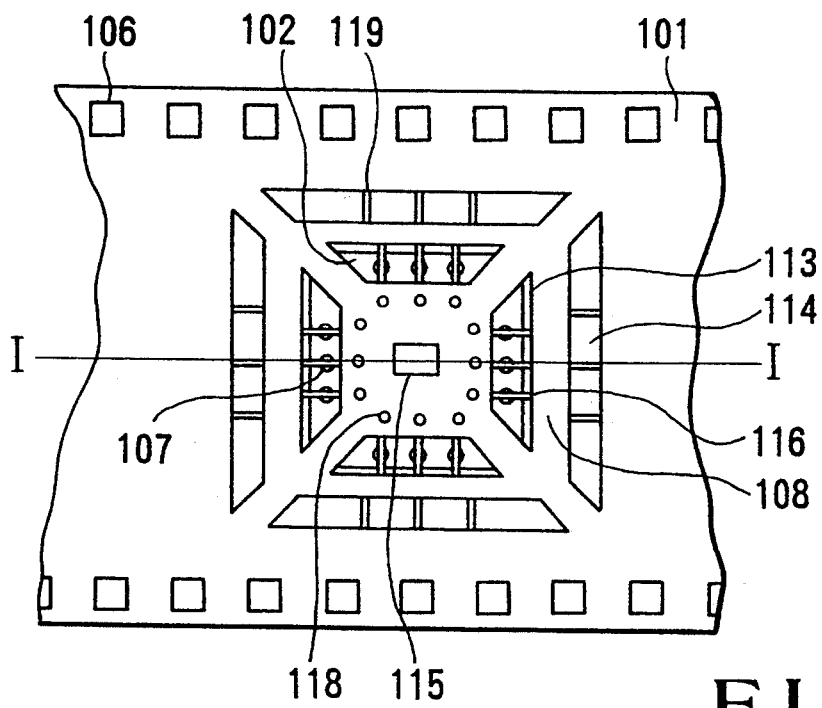
Figure 1B:
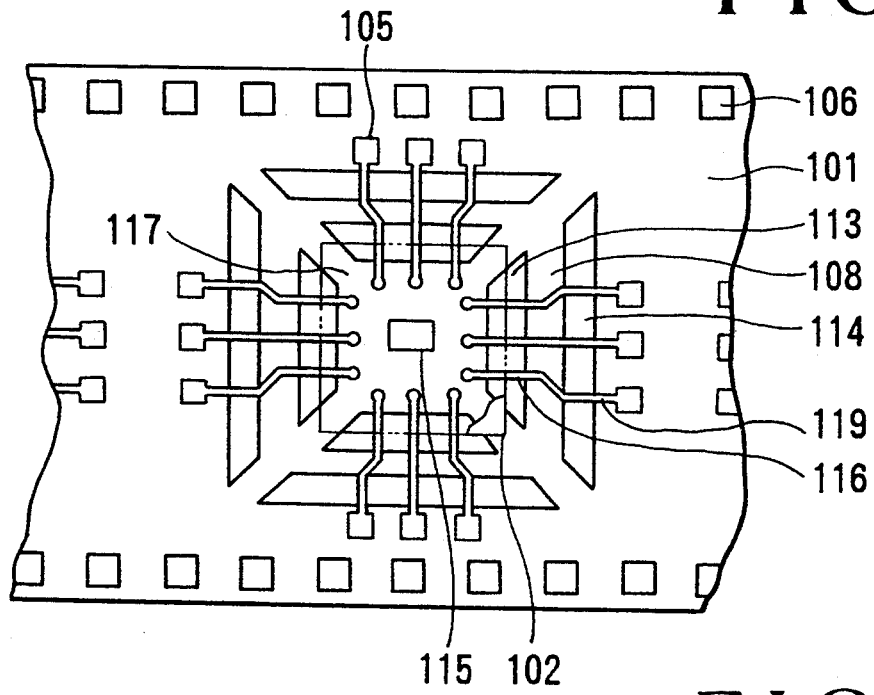
Figure 1C:
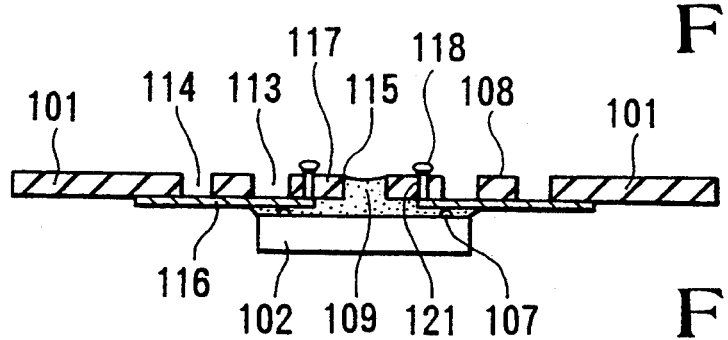

FIG. 1A is a bottom view showing the main part of the first embodiment of a film carrier semiconductor device according to the present invention, and FIG. 1B is a plan view showing the same. FIG. 1C is a sectional view taken along a line I—I of FIG. 1A. The film carrier semiconductor device according to this embodiment comprises an elongated film carrier tape 101 consisting of a polyimide film or the like and having a predetermined thickness, a semiconductor chip 102 with bumps 107 as metal projecting portions formed on electrode pads (not shown), inner lead bonding (ILB) leads 116 formed into a desired shape by, e.g., etching a metal foil, such as a copper foil, adhered to the surface of the film carrier tape 101, outer lead bonding (OLB) leads 119, and pads 105 for electrical selection.

The film carrier tape 101 has carrying and positioning sprocket holes 106 in its both edge portions and an OLB bump mounting portion 117 formed in its central portion where the semiconductor chip 102 is to be mounted. ILB holes 113 and OLB holes 114 are formed to constitute a substantially double hole structure around the bump mounting portion 117, and a resin encapsulating hole 115 is formed in the central portion of the bump mounting portion 117. OLB bumps 118 for mounting the device on a printed circuit board in a flip chip manner are also formed on the lower surface side of the bump mounting portion 117. A portion of the tape between the ILB holes 113 and the OLB holes 114 constitutes a suspender 108 for the ILB leads 116.

The ILB holes 113 are constituted by four trapezoidal opening portions formed to surround the four sides of the semiconductor chip 102, and the semiconductor chip 2 is mounted on the OLB bump mounting portion 117 such that the bumps 107 face these holes 113. The ILB leads 116 are formed in the opening portions of the ILB holes 113 so as to overlap the bumps 107 and bonded to the bumps 107 of the semiconductor device 102 over the opening portions of the ILB holes 113. One end of each ILB lead 116 is extended to the OLB bump mounting portion 117 and connected to a corresponding one of the OLB bumps 118 on the lower side of the tape through a through hole 121. The other end of each ILB lead 116, on the other hand, is connected to one end of a corresponding one of OLB leads 119 formed above the OLB holes 114 outside the ILB holes 113. The other end of each OLB lead 119 is connected to a corresponding one of the pads 105 for electrical selection arranged outside the OLB holes 114. The OLB holes 114 are constituted by four trapezoidal opening portions so formed as to surround the ILB holes 113. The semiconductor chip 102 is mounted on the side of the OLB bump mounting portion 117 corresponding to the upper surface side of the tape and encapsulated with a resin 109 filled from the lower surface side of the tape through the resin encapsulating hole 115.

A method of fabricating the film carrier semiconductor device having the above arrangement will be described below.

Figure 2A:
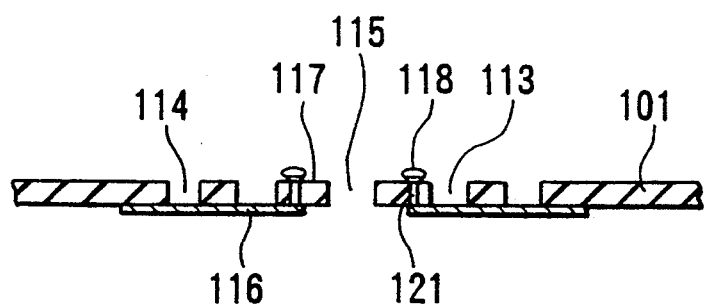
FIGS. 2A and 2B are sectional views showing the steps of a method of fabricating the film carrier semiconductor device shown in FIGS. 1A to 1C.
Figure 2B:
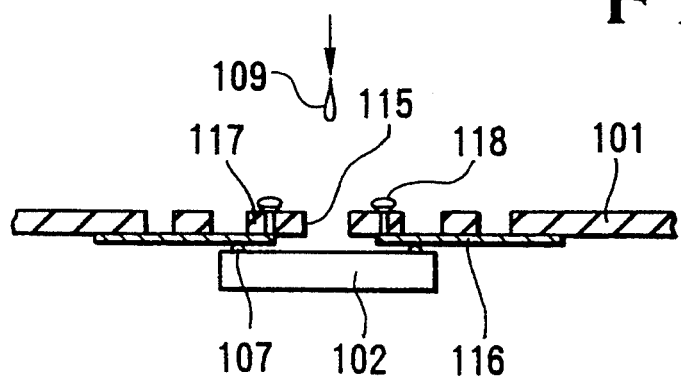

FIGS. 2A and 2B illustrate fabrication steps of the film carrier semiconductor device shown in FIGS. 1A to 1C.

First, the film carrier tape 101 as a base film, which is formed elongated and has no holes in it, is prepared, and a metal foil, such as a copper foil, is laminated on one surface of the tape by an adhesive. Subsequently, opening portions of the sprocket holes 106, the ILB holes 113, the OLB holes 114, and the resin encapsulating hole 115 are formed in predetermined positions of the film carrier tape 101 by, e.g., punching. A metal foil, such as a copper foil, is also laminated using an adhesive on the other surface of the film carrier tape 101 to which the first metal foil is not adhered. Subsequently, a photoresist process is performed to form lead patterns of the ILB leads 116 and the OLB leads 119, the pads 105 for electrical selection, and a through hole land at a position where the OLB bumps 118 are to be formed. That is, a resist is coated on both the upper and lower surfaces of the film carrier tape 101 to form the through hole land for forming the OLB bumps 118 on the lower surface and the lead pattern including the through hole land and the pads 115 for electrical selection on the upper surface, through steps of two-surface exposure, development, etching, and removal of the resist.

Subsequently, preliminary holes for the through holes 121 are formed in the through hole land by, e.g., punching or drilling. Metal plating of, e.g., copper is performed for these preliminary holes, thereby forming the conductive through holes 121. The through holes 121 are finished by performing predetermined plating with, e.g., gold or tin.

The OLB bumps 118 are formed on the through hole land on the lower surface side of the tape. As a bump forming method of this type, it is possible to use known conventional techniques, as described in Japanese Patent Laid-Open No. 49-52973, in which balls are formed on wires consisting of, e.g., gold or solder, by a wire bonding process and bonded to pads, and the bumps 118 are formed by connecting the wires such that only the balls are left. The state obtained up to this point is illustrated in FIG. 2A; in this state, the semiconductor chip 102 has not been mounted yet.

Subsequently, as shown in FIG. 2B, The ILB leads 116 and the bumps 107 of the semiconductor chip 102 are bonded together by, e.g., thermocompression bonding or eutectic bonding, thereby mounting the semiconductor chip 102 on the OLB bump mounting portion 117 of the film carrier tape 101. Thereafter, the liquid encapsulating resin 109 is dropped in the resin encapsulating hole 115 to encapsulate the semiconductor chip 102, thereby fabricating a pseudo flip chip.

Examples of the resin 109 are an epoxy-based resin, a silicone-based resin, a silicone-epoxy-based resin, and a Teflon-based resin. When the semiconductor chip 102 is mounted on a printed circuit board, a stress produced by differences between thermal expansion coefficients of the encapsulating resin 109, the printed circuit board, the OLB bump mounting portion 117, and the semiconductor chip 102 is applied to the bonded portions of the OLB bumps 118. To reduce this stress applied to the bonded portions of the OLB bumps 118, it is desirable to use, as the resin 109, a silicone- or Teflon-based resin which maintains its rubber-like properties even after set. In addition, when the semiconductor chip 102 is encapsulated with the resin 109, control is performed such that the surface of the resin 109 does not exceed the height of the OLB bump 118 as shown in FIG. 1C.

After the semiconductor chip 102 is mounted on the OLB bump mounting portion 117 and encapsulated by the resin 109, a probe is selectively brought into contact with each pad 105 for electrical selection to perform, e.g., electrical selection or a bias test, thereby inspecting the resultant structure. A structure passing the inspection is selected as a film carrier semiconductor device. The film carrier semiconductor device thus fabricated is mounted on a printed circuit board.

Figure 3:
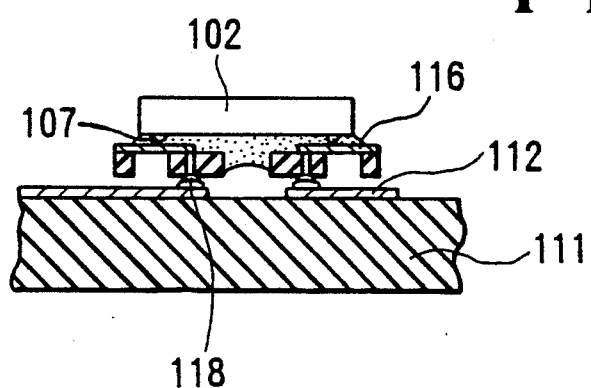
FIG. 3 is a sectional view showing a printed circuit board on which the film carrier semiconductor device shown in FIGS. 1A to 1C is mounted.

FIG. 3 illustrates a state in which the film carrier semiconductor device shown in FIGS. 1A to 1C is mounted on a printed circuit board.

To mount the film carrier semiconductor device, the ILB leads 116 of the film carrier semiconductor device are cut at the portion of the suspender 108 to separate the film carrier semiconductor device from the film carrier tape 101. Subsequently, bonding pads 112 of a printed circuit board 111 and the OLB bumps 118 of the film carrier semiconductor device are bonded together, thereby mounting the film carrier semiconductor device on the printed circuit board 111. To bond the OLB bumps 118, the OLB bumps 118 may be made of solder and bonded by melting them, as in conventional flip chips. Alternatively, the OLB bumps 118 may be made of gold and directly adhered by coating a conductive paste. That is, any appropriate method can be performed in accordance with the type of the OLB bumps 118.

Note that although the film carrier semiconductor device of this embodiment comprises the OLB holes 114 and the OLB leads 119, they are unnecessary if packaging is performed in the same manner as flip chips as described above. The OLB holes 114 and the OLB leads 119 are used in mounting the device in the same manner as conventional film carrier semiconductor devices. That is, the film carrier semiconductor device of this embodiment has a structure capable of meeting both the packaging methods.

FIG. 4 illustrates a film carrier tape showing the second embodiment of a film carrier semiconductor device according to the present invention.

The difference of this embodiment from the above first embodiment is that an OLB bump mounting portion 225 is supported by tiebars 223, one end of each ILB lead 226 projects from the OLB bump mounting portion 225 to a position of a corresponding one of electrode bumps of a semiconductor chip in ILB holes 224, and its other end is extended from the OLB bump mounting portion 225 and connected via the tiebar 223 to a corresponding one of pads 205 for electrical selection arranged outside the ILB holes 224. Therefore, the ILB leads 226 are held only by the OLB bump mounting portion 225, i.e., cantilevered. OLB bumps 218 are formed on the lower surface of a film carrier tape 222. The ILB leads 226 are connected to the OLB bumps 218 on the lower surface of the tape through holes 221 (FIG. 5A) formed at appropriate positions of the OLB bump mounting portion 225.

The film carrier tape 222 of this embodiment has a structure similar to that of the first embodiment described above except that the ILB leads 226 are cantilevered and therefore can be fabricated by substantially the same fabrication method as the first embodiment.

A semiconductor chip 202 is mounted on the film carrier tape 222 of this embodiment by bonding bumps 207 of the semiconductor chip 202 to the ILB leads 226 of the film carrier tape 222.

FIGS. 5A and 5B illustrate the assembled states of the film carrier semiconductor device shown in FIG. 4: FIGS. 5A and 5B are sectional views showing the structures of face-down bonding and face-up bonding, respectively, taken along a line II—II of FIG. 4. Since the ILB leads 226 are cantilevered in this embodiment, the face-up bonding shown in FIG. 5B can be performed easily in addition to the face-down bonding shown in FIG. 5A.

In the face-up bonding, the OLB bumps 218 are formed on the same surface as the pattern of the ILB leads 226. To prevent a short circuit with a wiring pattern on a printed circuit board when the device is mounted on the printed circuit board, it is also possible to cover portions except for the OLB bumps 218 with an insulating film such as a solder resist 227. In this face-up bonding, the fabrication process of the film carrier tape 222 is advantageously simplified because no through holes need be formed.

Subsequently, as in the first embodiment, the semiconductor chip 202 is resin-encapsulated and subjected to an electrical test, thereby completing the film carrier semiconductor device.

After the tiebars 223 are cut, the completed device is mounted on a printed circuit board in the same manner as in the first embodiment by bonding the OLB bumps 218 to bonding pads of the printed circuit board.

This embodiment is applied only to flip chip type packaging and applicable preferably to a memory or the like in which the semiconductor chip 202 is rectangular and the bumps 207 are concentrated on its short sides because a predetermined pattern of the ILB leads is formed on the tiebars 223.

Figure 6A:
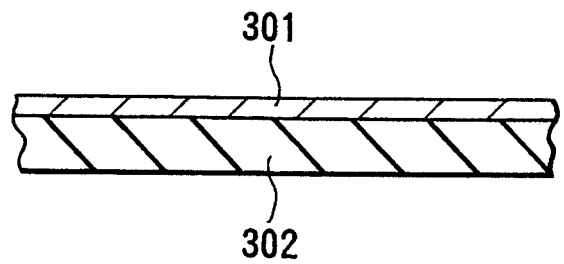
FIGS. 6A to 6C are sectional views for explaining a method of fabricating a film carrier tape for use in the present invention in an order of fabrication steps.
Figure 6B:
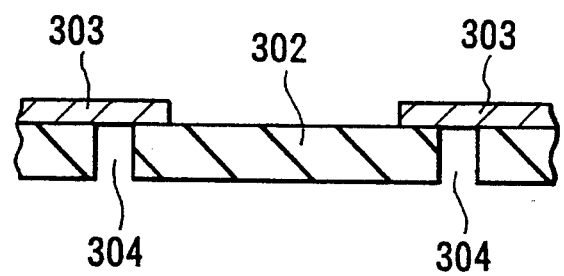
Figure 6C:
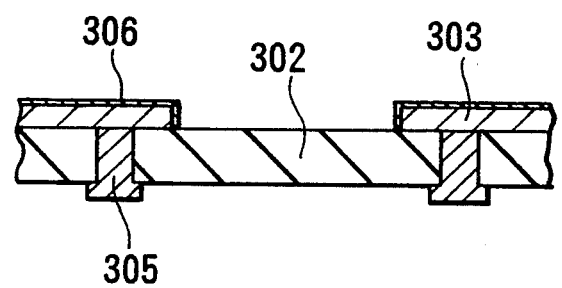

FIGS. 6A to 6C illustrate a method of fabricating a film carrier tape for use in the present invention in an order of fabrication steps.

First, as shown in FIG. 6A, a liquid polyimide resin is uniformly coated on the surface of a metal foil 301 consisting of a 42 alloy (Fe-Ni alloy) having a thermal expansion coefficient of $4.5 \times 10^{-6}$ to $5.0 \times 10^{-6°}$ $C.^{-1}$ or Fernico (Fe-Ni-Co alloy) having a thermal expansion coefficient of $4.0 \times 10^{-5}$ to $4.7 \times 10^{-6°}$ $C.^{-1}$ and thermally set to form a base film 302 having a thermal expansion coefficient of $2.0 \times 10^{-5}$ to $7.0 \times 10^{-5°}$ $C.^{-1}$.

Subsequently, as shown in FIG. 6B, the metal foil 301 is selectively patterned to form leads 303 by a photolithographic process, and the base film 302 is similarly patterned to form through holes 304 for exposing the surfaces of the leads 303.

As shown in FIG. 6C, bumps 305 consisting of Au or solder are formed on the lower surfaces of the leads 303 in the through holes 304 so as to project from the lower surface of the base film 302, and a plating film 306 consisting of Au or solder is formed on the upper surfaces of the leads 303, thereby completing the film carrier tape.

Figure 7:
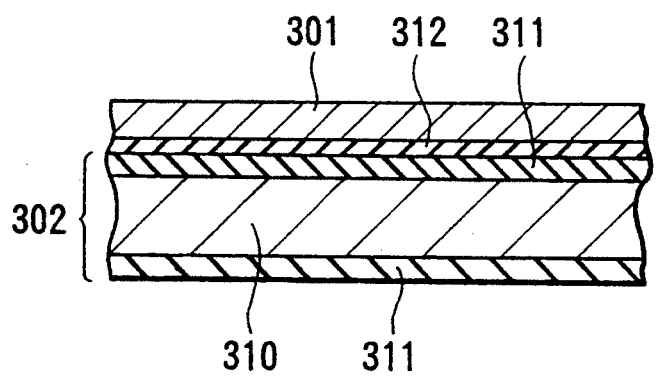
FIG. 7 is a sectional view showing another film carrier tape for use in the present invention.
Figure 8A:
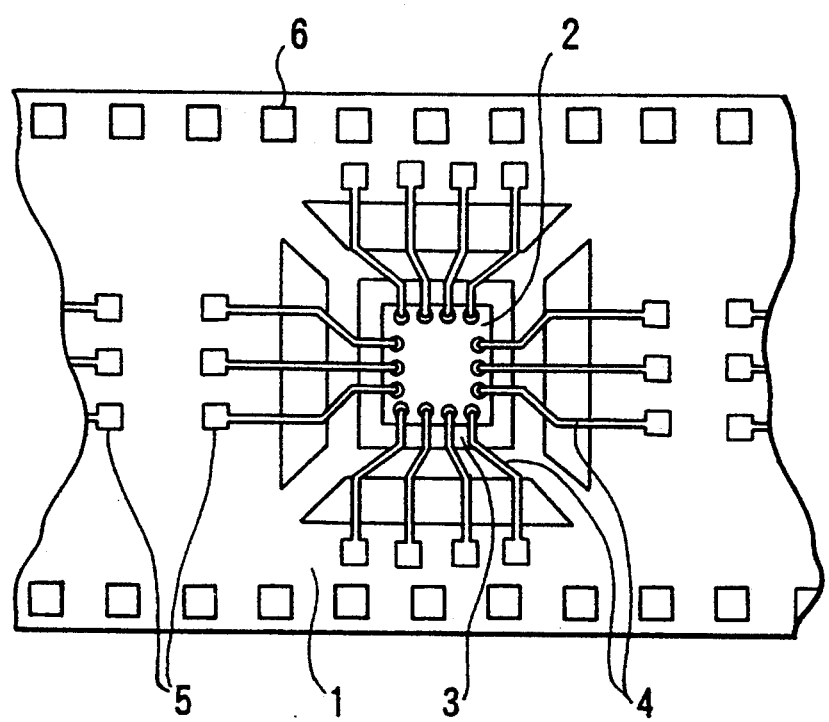
FIGS. 8A to 8C are a plan view showing the main part of an example of a conventional film carrier semiconductor device, a sectional view showing the same, and a sectional view showing a condition in which the film carrier semiconductor device is mounted on a printed circuit board, respectively.
Figure 8B:
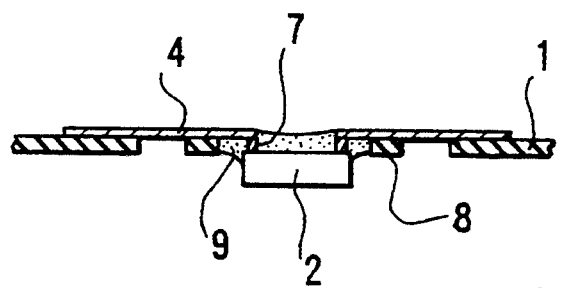
Figure 8C:
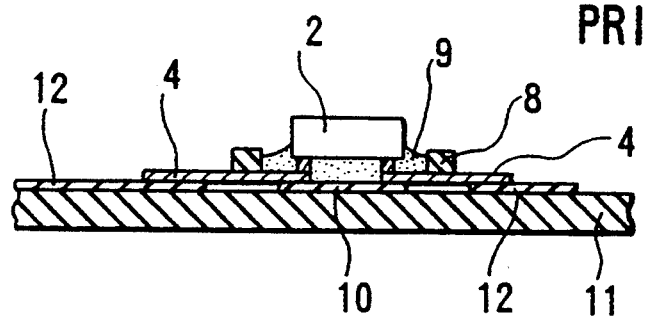

FIG. 7 illustrates another film carrier tape for use in the present invention.

As shown in FIG. 7, this film carrier tape has the same structure as that shown in FIGS. 6A to 6C except that polyimide resin films 311 having a thermal expansion coefficient of $2.0 \times 10^{-5}$ to $7.0 \times 10^{-6°}$ $C.^{-1}$ are coated to have a thickness of less than 20 μm on both the surfaces of a metal foil 310 having a thickness of 100 μm and consisting of a 42 alloy or Fernico, thereby forming a base film 302, and that a metal foil 301 for lead formation is laminated on the base film 302 via an adhesive 312. Since the thermal expansion coefficients of the metal foils 310 and 301 are close, it is possible to realize a carrier tape free from curling caused by an influence of heat. Note that the thickness of the adhesive 312 is preferably as small as less than 10 μm.

As has been described above, the film carrier semiconductor device of the present invention comprises an OLB bump mounting portion, and OLB bumps formed on the OLB bump mounting portion, to each of which one end of a lead for inner lead bonding is connected. Therefore, the device has a high reliability in connections and can achieve high-density packaging equivalent to that of a flip chip while maintaining an advantage in that a burn-in test can be easily performed by using pads for electrical selection.

In addition, since the film carrier tape is formed using a base film and leads having thermal expansion coefficients close to that of a semiconductor chip, stress rupture due to a thermal expansion difference can be effectively prevented after a heating process.

What is claimed is:

1. A film carrier semiconductor device comprising:
    a film carrier tape consisting of a tape-like insulating material and having carrying and positioning sprocket holes in both edge portions thereof;
    an outer lead bonding bump mounting portion formed in a central portion of said film carrier tape;
    said film carrier tape having inner lead bonding holes formed around said outer lead bonding bump mounting portion;
    a semiconductor chip mounted on said outer lead bonding bump mounting portion and having electrode bumps outwardly projecting from a surface of the semiconductor chip;
    inner lead bonding leads formed into a predetermined pattern on said film carrier tape and bonded to said electrode bumps at locations opposing said inner lead bonding holes; and
    outer lead bonding bumps formed on said outer lead bonding bump mounting portion, to each of which one end of a corresponding one of said inner lead bonding leads is connected,
    said outer lead bonding bump mounting portion having a resin encapsulating hole formed therein and a resin material received in said encapsulating hole and encapsulating said semiconductor chip from a lower surface of said film carrier tape,
    wherein said outer lead bonding bumps are formed on a lower surface of said film carrier tape and connected to said outer lead bonding bumps through conductive through holes.

2. A device according to claim 1, wherein said film carrier tape includes outer lead bonding holes formed around said inner lead bonding holes, outer lead bonding leads are formed to oppose said outer lead bonding holes, the other end of each of said inner lead bonding leads each having one end connected to a corresponding one of said outer lead bonding bumps is connected to one end of a corresponding one of said outer lead bonding leads, and the other end of each of said outer lead bonding leads is connected to a corresponding one of pads for electrical selection formed outside said outer lead bonding holes.

3. A device according to claim 2, wherein a portion of said film carrier tape between said inner lead bonding holes and said outer lead bonding holes constitutes a suspender for preventing deformation of said inner lead bonding leads.

4. A device according to claim 1, wherein said inner lead bonding leads are formed in a cantilever state in which one end of each of said inner lead bonding leads is held by said outer lead bonding bump mounting portion.

5. A device according to claim 4, wherein said outer lead bonding bumps are formed on an upper surface side of said outer lead bonding bump mounting portion, and said semiconductor chip is mounted by face-up bonding by connecting the other end of each of said inner lead bonding leads to a corresponding one of said electrode bumps on the lower surface side of said film carrier tape.

6. A device according to claim 1, wherein said film carrier tape and said inner lead bonding leads consist of materials having thermal expansion coefficients close to that of said semiconductor chip.

7. A device according to claim 6, wherein said film carrier tape consists of a polyimide resin, and said inner lead bonding leads consist of a 42 alloy.

8. A device according to claim 6, wherein said film carrier tape consist of a polyimide resin, and said inner lead bonding leads consist of Fernico.

9. A device according to claim 6, wherein the thermal expansion coefficient of said base film is $2.0 \times 10^{-6\circ} C.^{-1}$ to $7.0 \times 10^{-6\circ} C.^{-1}$.

10. A film carrier tape comprising:
a base film consisting of a polyimide resin having a thermal expansion coefficient close to that of a semiconductor chip; the thermal expansion coefficient of said base film being $2.0 \times 10^{-6\circ} C.^{-1}$ to $7.0 \times 10^{-6\circ} C.^{-1}$;
leads formed on said base film and made of a material selected from the group consisting of 42 alloy and Ferico having a thermal expansion coefficient close to that of a semiconductor chip;
a bump mounting portion, formed in a central portion of said base film, for mounting the semiconductor chip thereon;
through holes formed in said bump mounting portion at positions immediately below said leads;
bumps formed in said through holes so as to project from a lower surface of said base film and connected to said leads;
lead bonding holes formed around said bump mounting portion, said leads being bonded to electrode bumps of the semiconductor chip at said lead bonding holes;
a resin encapsulating hole formed in said bump mounting portion; and a resin material filling said hole and encapsulating the semiconductor chip from the lower surface of said base film.

11. A film carrier semiconductor device comprising:
a film carrier tape consisting of a tape-like insulating material and having carrying and positioning sprocket holes in both edge portions thereof;
an outer lead bonding bump mounting portion formed in a central portion of said film carrier tape;
said film carrier tape having inner lead bonding holes formed around said outer lead bonding bump mounting portion;
a semiconductor chip mounted on said outer lead bonding bump mounting portion and having electrode bumps outwardly projecting from a surface of the semiconductor chip;
inner lead bonding leads formed into a predetermined pattern on said film carrier tape and bonded to said electrode bumps at locations opposing said inner lead bonding holes; and
outer lead bonding bumps formed on said outer lead bonding bump mounting portion, to each of which one end of a corresponding one of said inner lead bonding leads is connected,
said outer lead bonding bump mounting portion having a resin encapsulating hole formed therein, and a resin material filling said hole and encapsulating said semiconductor chip from a lower surface of said film carrier tape;
wherein:
said film carrier tape includes outer lead bonding holes formed around said inner lead bonding holes, outer lead bonding leads are formed to oppose said outer lead bonding holes, the other end of each of said inner lead bonding leads each having one end connected to a corresponding one of said outer lead bonding bumps is connected to one end of a corresponding one of said outer lead bonding leads, and the other end of each of said outer lead bonding leads is connected to a corresponding one of pads for electrical selection formed outside said outer lead bonding holes;
a portion of said film carrier tape between said inner lead bonding holes and said outer lead bonding holes constitutes a suspender for preventing deformation of said inner lead bonding leads; and
said outer lead bonding bumps are formed on a lower surface of said film carrier tape and connected to said outer lead bonding bumps through conductive through holes.

* * * * *